US 6,624,432 B1

(12) United States Patent
Gabower et al.

(10) Patent No.: US 6,624,432 B1
(45) Date of Patent: Sep. 23, 2003

(54) EMI CONTAINMENT APPARATUS

(75) Inventors: John F. Gabower, Mauston, WI (US); Louis Sylvester Hughes, Incline Village, NV (US)

(73) Assignee: Shielding for Electronics, Inc., Sunnyvale, CA (US)

( * ) Notice: Subject to any disclaimer, the term of this patent is extended or adjusted under 35 U.S.C. 154(b) by 246 days.

(21) Appl. No.: 09/684,188

(22) Filed: Oct. 6, 2000

Related U.S. Application Data

(60) Provisional application No. 60/158,435, filed on Oct. 12, 1999.

(51) Int. Cl.$^7$ .............................. G21F 7/00; G21F 3/04; B32B 3/00; B32B 15/00; H05K 9/00
(52) U.S. Cl. .............................. 250/515.1; 250/517.1; 174/35 MS; 174/35 R; 428/161; 428/164; 361/816; 361/818
(58) Field of Search ................... 250/515.1; 156/659.1, 156/633, 663, 654, 668, 655; 412/223; 334/85; 379/433.1; 29/841, 840; 264/164, 231, 232, 237, 299, 291, 293, 294, 306, 348, 517; 439/75, 528, 538; 455/90, 300, 575, 301, 117, 128, 351, 347–349

(56) References Cited

U.S. PATENT DOCUMENTS

| 4,106,839 A | | 8/1978 | Cooper .................... 339/143 R |
| 4,489,116 A | | 12/1984 | Flood ......................... 428/138 |
| 4,542,076 A | | 9/1985 | Bednarz et al. ............. 428/624 |
| 4,661,888 A | | 4/1987 | Jewell et al. |
| 4,714,905 A | | 12/1987 | Bernstein et al. ............ 333/167 |
| 4,759,466 A | * | 7/1988 | Chase et al. ................ 220/4.02 |
| 4,959,752 A | * | 9/1990 | Samarov et al. ............. 361/818 |
| 4,988,550 A | | 1/1991 | Keyser et al. ................ 428/40 |
| 5,034,856 A | | 7/1991 | Cook et al. |
| 5,047,260 A | | 9/1991 | Durand ....................... 427/541 |
| 5,071,519 A | | 12/1991 | Ferrill et al. ................. 705/164 |
| 5,107,404 A | | 4/1992 | Tam ............................ 361/424 |

(List continued on next page.)

FOREIGN PATENT DOCUMENTS

JP 06204678 A * 7/1994 ............ H05K/9/00

OTHER PUBLICATIONS

US 5,740,818, 4/1998, Rumbut, Jr. (withdrawn)
Walter Hasler, "Electroplating and Vacuum Metalizing", Technical Report, Balzers Aktiengesellschaft, Lichtenstein, published in *Galvanotechnic,* 2 (1984).
Dieter Gwinner, "Vacuum Evaporated Aluminum for Selective Shielding of Plastic Housings", *ITEM 1993 The International Jrnl of EMC,* 1993.
Kimmel & Gerke, "Chapter 7: Shielding for EMI control . . . and how to do it right", *EDN,* Jan. 20, 1994 Supplement.

*Primary Examiner*—John R. Lee
*Assistant Examiner*—Bernard E. Souw
(74) *Attorney, Agent, or Firm*—Allan L. Harms

(57) ABSTRACT

An EMI and RFI shield mounting system includes a compartmented EMI shield constructed of a vacuum metallized thermoform having upright hollow walls separating and surrounding the compartments. The shield conforms to the interior of a housing for electronic equipment, with the upright walls overlying ridges formed in the interior of the housing. A compressible gasket is placed between the ridges of the housing and the inner reaches of the hollow walls of the shield. The free sides of the walls of the shield may be abutted against ground traces on a printed circuit board on which the shield and housing are placed. The gasket urges the metallized free edges of the walls of the shield against the ground trace of the printed circuit board to provide electrical conductivity between the printed circuit board and the shield. Dimples, tabs or protruding punctures may be formed in the free sides of the walls to ensure conductive contact with the ground trace.

27 Claims, 7 Drawing Sheets

U.S. PATENT DOCUMENTS

| | | | |
|---|---|---|---|
| 5,170,009 A | 12/1992 | Kadokura | 174/35 R |
| 5,180,639 A | 1/1993 | Zarnoch | 428/412 |
| 5,191,544 A | 3/1993 | Benck et al. | |
| 5,206,796 A | 4/1993 | Thompson et al. | 361/424 |
| 5,225,629 A | 7/1993 | Garrett | 174/365 R |
| 5,226,210 A | 7/1993 | Koskenmaki et al. | |
| 5,235,492 A | 8/1993 | Humbert et al. | |
| 5,250,342 A | 10/1993 | Lang et al. | 428/138 |
| 5,270,488 A | 12/1993 | Ono et al. | 174/35 R |
| 5,416,668 A * | 5/1995 | Benzoni | 361/816 |
| 5,519,168 A * | 5/1996 | Owens | 174/35 MS |
| 5,519,169 A * | 5/1996 | Garrett et al. | 174/35 R |
| 5,550,713 A | 8/1996 | Pressler et al. | 361/818 |
| 5,566,055 A * | 10/1996 | Salvi, Jr. | 361/816 |
| 5,704,117 A | 1/1998 | Mok et al. | |
| 5,811,050 A | 9/1998 | Gabower | 264/299 |
| 5,822,690 A | 10/1998 | Rynk et al. | |
| 5,872,332 A * | 2/1999 | Verma | 174/35 C |
| 6,031,732 A | 2/2000 | Koike et al. | |
| 6,063,999 A | 5/2000 | Kelly | 174/35 |
| 6,121,545 A | 9/2000 | Penget et al. | |
| 6,121,546 A | 9/2000 | Erickson et al. | |
| 6,195,267 B1 * | 2/2001 | MacDonald et al. | 361/800 |
| 6,233,153 B1 | 5/2001 | Baur et al. | |
| 6,271,465 B1 | 8/2001 | Lacey | |
| 6,275,683 B1 | 8/2001 | Smith | |
| 6,570,085 B1 * | 5/2003 | Gabower | 174/35 MS |
| 2001/0033478 A1 * | 10/2001 | Ortiz et al. | 361/818 |
| 2001/0040043 A1 * | 11/2001 | Ortiz et al. | 174/117 F |
| 2002/0071940 A1 * | 6/2002 | Arnold et al. | 428/195 |
| 2002/0117315 A1 * | 8/2002 | Gabower | 174/35 R |

OTHER PUBLICATIONS

"EMI Protection in Consumer Portable Products", *Electronic Packaging and Production*, Mar. 1994.

Leonard, "What's hot and what's not in EMI shielding of plastics", *Plastic Design Forum*, Mar./Apr. 1993.

Minnesota Mining & Mfg. Co., "6100 Thermoformable EMI–Shielding Material", 1994.

"Silver–Coated VALOX FR–1 Film Provides Shielding For Circuit Breakers", *GE Films in Action*, Jun. 1994, General Electric Co.

"Orion® Designs Economical EMI Shielding Box Without Cutting Corners", product brochure, Orion Industries Incorporated.

Concise Encyclopedia of Polymer Science & Engineering, John Wiley & Sons, 1990 ISBN 0–471–51253–2, pp. 446–447, 744–746, 1192–1195.

Degassing of Plastic Materials/Plasticizers, L. Holland, "Vacuum Deposition of Thin Films", Chapman & Hall Ltd., London 1966, pp. 46–47, 52–53.

Aluminum Evaporation (Time–Temp.) T. LaBounty, "How Do Others Metallize?", Midwest Technical Service, "Tips", 1980 p. 19.

"Machinery's Handbook", E. Grerg, F. Jones and A. Horton, Industrial Press, New York, NY 1976, pp. 2299–2301.

D. Rigney, "Vacuum Coating", pp. 387–388, 390–410.

Leon I. Maissel & Reinhard Glang, "Handbook of Thin–Film Technology", McGraw–Hill 1970, pp. 1–7, 8; 1–26 et seq; 1–38, 39.

Placon Corp., Madison, Wisconsin Sales Brochure.

Gabower, John H. (Jack), Thermoformed Vacuum Metallized Inserts for EMI Shielding of Electronic Devices, Consumer Electronics Show, Flamingo Hilton and Tower, Las Vegas, Nevada.

Adams, Frank; "Taking the Mystery Out of Metallizing"; Technical Publishing Company, 1975, 1976.

Midwest Tungsten Service, Tips—Vacuum Metallizing Electrical Problems, 1986.

Mooney, "Trend to Lower Cost Resins Will Accelerate", *Plastics World*, Apr. 1995.

"Style CBS Circuit Board Component Shielding—Design Guide 4", product brochure, Leader Tech, Tampa, Florida.

Product Announcement, BMI, Inc., "Modular Shielding System" *EE–Evaluation Engineering*, Apr. 1995.

Ultrasonic Welders Advance Clamshell–Sealing Process, *Packaging*, Oct. 1994.

"Methods of Controlling EMI", *EMI/RFI Shielding Guide*, General Electric Plastics Co.

Chomerics, Inc., "EMI Shielding for Commercial Electronics", 1994.

Gabower, Jack (John H.), "Thermoformed Vacuum—Metallized Inserts for EMI Shielding", *Item 1995—The International Journal of EMC*, Robar Industries, Inc., 1995, pp. 120, 122, 127.

Vacuum Platers, Inc., "VAEMAT High Performance Vacuum Evaporated Film Coatings", Product Data Sheet.

Vacuum Platers, Inc., Advertising Folder.

* cited by examiner

EMI CONTAINMENT APPARATUS

CROSS REFERENCE TO RELATED APPLICATIONS

This application [is converted from] claims the benefit under 35 U.S.C. §119(e) and 37 C.F.R. §1.78 of copending provisional patent application entitled "EMI and RFI Containment Method for Electronic Enclosures", Ser. No. 60/158,435 filed Oct. 12, 1999.[,from which this application claims priority.]The disclosure of provisional patent application Ser. No. 60/158,435 is hereby incorporated in its entirety.

STATEMENT REGARDING FEDERALLY SPONSORED RESEARCH OR DEVELOPMENT

Not Applicable.

BACKGROUND OF THE INVENTION

This invention pertains to shielding apparatus for containing high frequency electromagnetic radiation within a personal computer, cellular telephone, or other electronic instrument. Electromagnetic compatibility (EMC) is a broad term used to describe electromagnetic interference (EMI), radio frequency interference (RFI) and electrostatic discharge (ESD), and the above terms are often used interchangeably.

Electronic devices are both sources and receptors of EMI which creates a two-fold problem. Since electromagnetic radiation penetrating the device may cause electronic failure, manufacturers need to protect the operational integrity of their products. Secondly, manufacturers must comply with the regulations aimed at reducing electromagnetic radiation emitted into the atmosphere. Proper design is necessary to prevent the device's function from being disrupted by emissions from external sources and to minimize its system's emissions.

The use of plastic as a housing material for electronic equipment has contributed to problems with EMI shielding because EMI waves pass freely through unshielded plastic without substantial impedance or resistance. Increasing clock speeds of microprocessors used in computing devices makes it more difficult to handle the EMI emission faster computers generate.

Current methods for shielding of electromagnetic interference (EMI) include the use of metal housings, metal filled polymer housings, metal liners for housings, and conductive coatings for the interior of rigid polymer or composite housings. Recent development in low mass shields are shown in U.S. Pat. No. 5,811,050 to Gabower. Shields described in that patent are commercially produced by Shielding for Electronics, Inc. of Sunnyvale, California.

Ever increasing clock speeds of personal computers being offered makes effective shielding more and more challenging since any gap in an EMI shield which has one dimension in excess of one-half wavelength may allow substantial EMI leakage, causing the unit to fail United States Federal Communication Commission standards.

The use of metallic coatings on rigid plastic housings presents certain manufacturing and service concerns. A slipped tool used during assembly or a repair can cause a scratch in the metal coating of sufficient size to cause a slot antenna, thereby making the case totally useless, and thereby leading to a costly item being discarded with little feasibility for successful recycling. The seams of a metal plated plastic housing will act like slot antennae unless the housing sections are conductively joined by the use of overlapping joints, conductive gaskets, or conductive tape. When the housing must be opened for a repair or retrofit, it can be understood that some of the conductive interconnection may be degraded by the activity of disassembly.

Further background on prior art methods and characteristics of shielding methods may be examined in "EMI/RFI Shielding Guide" published by the GE Plastics Division of the General Electric Company, in "The EDN Designer's Guide to Electromagnetic Compatibility" by Gerke & Kimmel, Supplement to EDN Magazine, Volume 39, No. 2, (January, 1994) and in "Plastics in Electronic Equipment Enclosures: Emerging Economic and Environmental Issues"by Peter Mooney, published by Plastic Custom Research Services, Adorance, N.C. (February, 1995).

SUMMARY OF THE INVENTION

The invention is a novel EMI Containment System for use in electronic equipment enclosures. A multi-compartmented plastic form preferably made of thermoformed plastic sheet, that is, sheet or film material which has been heated and drawn by air pressure into a mold or onto a die, is coated with a conductive metal coating. The metal coating may be applied by painting or preferably by vacuum metallization as described in U.S. Pat. No. 5,811,050 to Gabower. The resulting metallized form has a metal coating covering its surface to a thickness of at least one micron and the wall thickness of the plastic form is quite small, in the range of 0.003 to 0.020 inches, resulting in an inexpensive, nestable multi-compartment EMI shield for placement over elements mounted on a circuit board which emit electromagnetic radiation. The compartments of the form are arranged such that the form will conform to the inside shape of a housing for an electronic equipment such as a cellular phone, computer, or other device which internally generates EMI or which is susceptible to degradation if exposed to RFI from outside the device. The form is constructed with a laterally extending peripheral lip and with hollow walls which separate the compartments and which fit over interior ribs formed within the enclosure to which the shape of the form conforms.

Non-conductive elastomeric gasket material which may be applied as a liquid is inserted between the tops of the ribs and outer sidewall of the housing and under the hollow ribs and the peripheral lip of the form, thereby providing a cushion between the form and the housing.

A circuit board containing the EMI emitting elements is placed against the form such that the EMI emitting elements are received within the compartments. The circuit board is provided with a conductive ground trace on its surface facing the form, the ground trace circumscribing a path which coincides with the hollow ribs and peripheral lip of the form. Contact between the metallized form and the ground trace of the circuit board serves to enclose the EMI emitters within a grounded enclosure to contain the EMI within the unit and isolated from other elements within the unit. When the circuit board is mounted within the housing, the gasket forces the lip and hollow walls of the form into contact with the ground trace of the circuit board.

The lip and hollow walls of the form may alternatively be formed with closely spaced dimples, puncture protrusions, or extending tabs, which are coated with metal and extend from the form to increase contact between the form and the ground trace of the circuit board, the spacing of the gap-filling dimples, puncture protrusions or extending tabs being selected to prevent spaces between them from acting as slot antennae. The elastomeric gasket may be omitted when the alternate embodiment form is used.

It is an object of the invention to provide an EMI containment apparatus which does not require. conductive gaskets to assure creation of a grounded enclosure around EMI emitting components.

It is another object of the invention to provide an inexpensive EMI shield system which permits shielding of EMI emitting components of an electronic device from susceptible components of the same device.

It is a further object of the invention to provide an inexpensive, lightweight EMI Shielding system.

It is a further object of the invention to provide an EMI containment system which provides conductive contact with a ground trace formed on the surface of a circuit board containing EMI emitting components.

It is another object of the invention to provide an EMI shield which may be shaped to conform to the internal ribbing of a rigid enclosure which needs no gasket element to create contact with a surfaced ground trace of a circuit board.

These and other objects of the invention will become apparent from examination of the description and claims which follow.

DETAILED DESCRIPTION OF THE INVENTION

Figure 1:
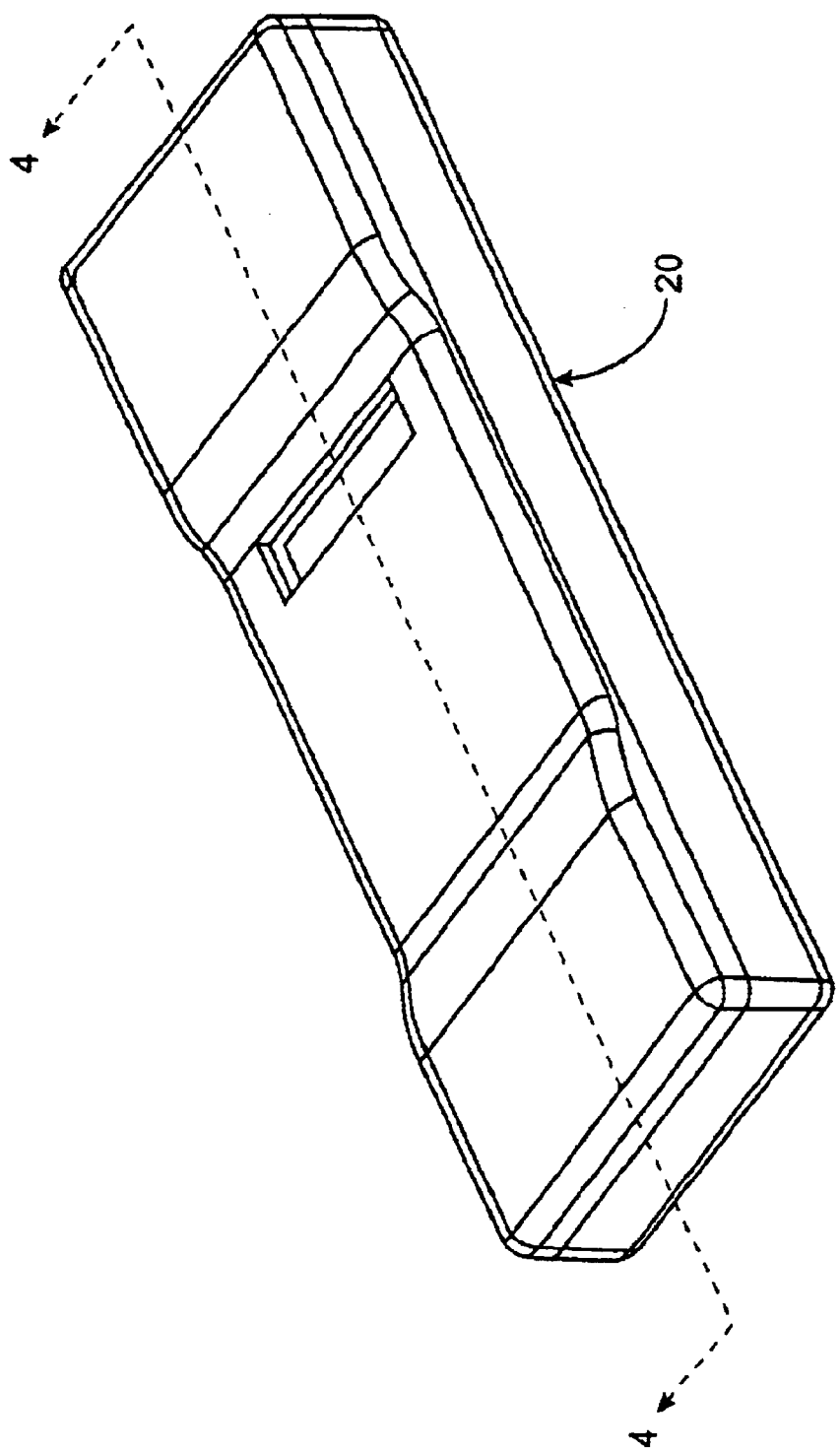
FIG. 1 is a perspective view of an electronic enclosure assembly 20.
Figure 2:
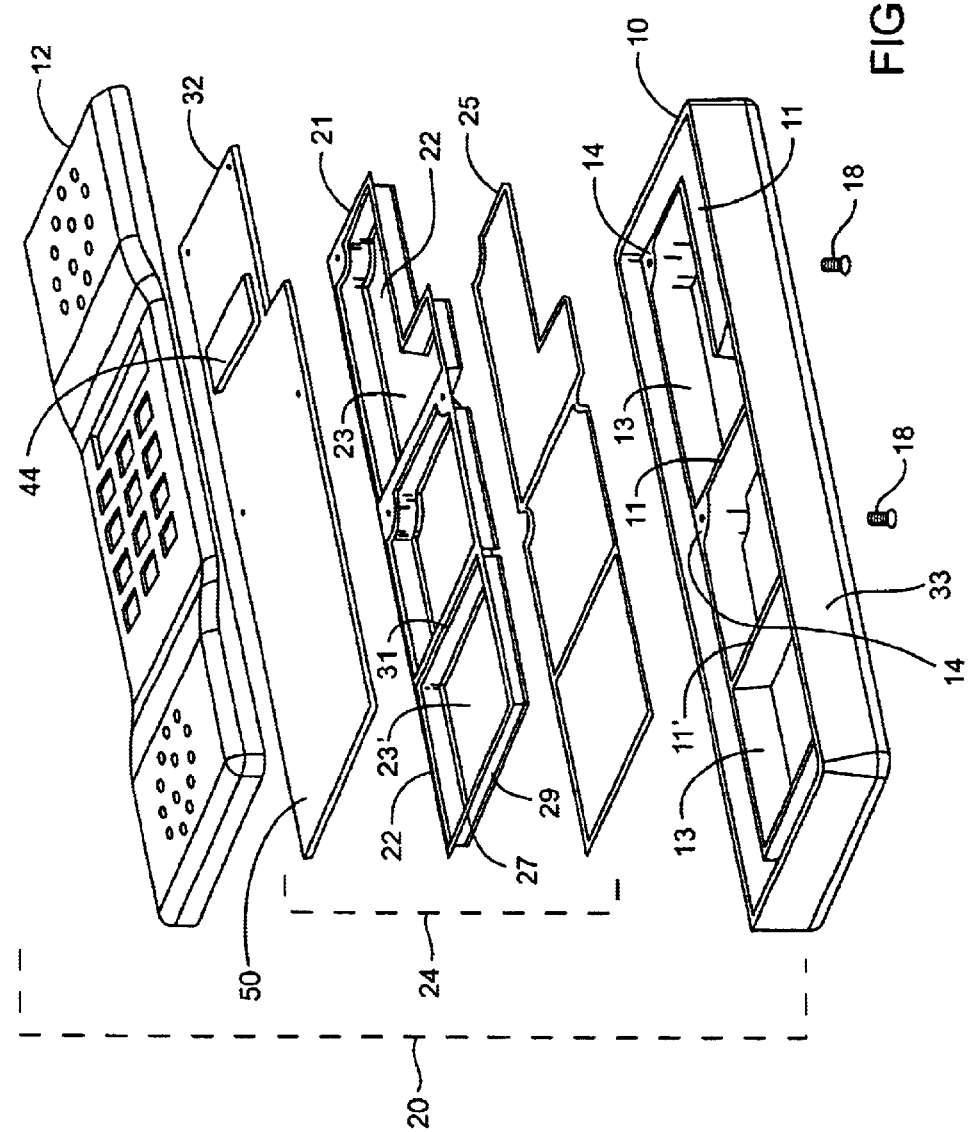
FIG. 2 is an exploded perspective view of the electronic enclosure assembly of FIG. 1.

Referring now to FIG. 1, an electronic enclosure assembly 20 of a cellular phone is a typical clamshell enclosure design and is shown in the assembled configuration, as it would be used. FIG. 2 shows an exploded view of electronic enclosure assembly 20 including a bottom enclosure housing 10 and a top enclosure housing 12. Bottom enclosure housing 10 contains a network of ribs 11, and a plurality of screw bosses 14. Electronic enclosure assembly 20 is fastened together with a plurality of screws 18, and a plurality of screw bosses 14. This fastening method is well known in the art of electronic enclosure design and the details have been omitted so that the focus may be on the present invention.

Figure 3:
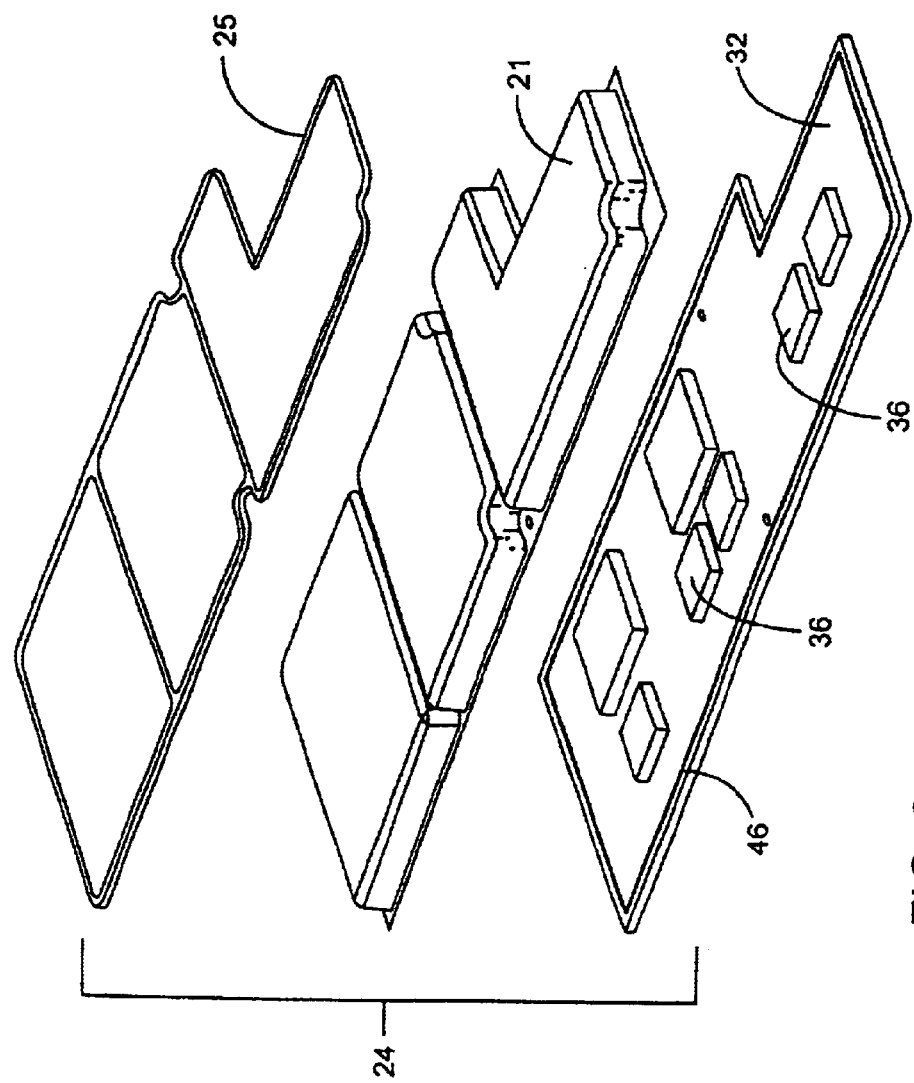
FIG. 3 is an exploded perspective view of a circuit board, EMI/RFI containment form and gap-filling gasket.

Electronic enclosure assembly 20 also includes an EMI/RFI containment form assembly 24, comprising an EMI/RFI containment form 21 coated with a conductive coating 22, preferably aluminum applied by vacuum metallization techniques, a printed circuit board 32, a plurality of electronic components 36, and a liquid crystal display 44. As shown in FIGS. 2 and 3, printed circuit board 32 is populated by a plurality of electronic components 36 electrically connected to it, and also has an internal ground plane 50 and an EMI/RFI ground trace 46 that is plated and exposed, on its surface facing the form 21. The shape of EMI/RFI ground trace 46 corresponds exactly to the shape of the top surface of EMI/RFI containment form 21, the shape of which in turn corresponds exactly to the shape of ribs 11. Other details of the design such as other active and passive circuit components, speakers, buttons, switches, antennae, wires, batteries, and corresponding holes and features in both bottom enclosure housing 10 and top enclosure housing 12, would be included in a functional design but have been omitted so as not to obscure the present invention.

Referring now to FIGS. 2 and 3, EMI/RFI containment form assembly 24 comprises an EMI/RFI containment form 21, a conductive coating 22 on EM/RFI containment form 21, and a gap-filling gasket 25. EMI/RFI containment form 21 is constructed out of either polyester or impact modified syndiocratic polystyrene thin film sheet, with a thickness of 0.003 inches to 0.020 inches depending on application requirements. An example of such a material is VALOX™, manufactured by General Electric Plastics of Pittsfield, Mass., or QUESTRA™, manufactured by Dow Corporation of Midland, Mich. This sheet material is formed into the shape of EMI/RFI containment form 21 by a variety of forming processes that are well known in the industry, such as vacuum forming, pressure forming, vacuum pressure forming, embossing, and injection molding among others. The shape of the compartments 23 in EMI/RFI containment form 21 are dictated by the shape of the cavities 13 in bottom enclosure housing 10, that is, EMI/RFI containment form 21 closely fits into the cavities created by ribs 11 in bottom enclosure housing 10. Containment form 21 includes a peripheral lip 27 which surrounds compartment 23 and extends laterally from outer sidewalls 29 of containment form 21. Compartments 23 are separated by narrow hollow walls 31 which receive ribs 11 of lower housing 10. Ribs 11 and outer wall 33 of lower housing 10 define cavities 13. Lip 27 of containment form 21 overlies ribs 11 or outer wall 33 of lower housing when containment assembly 24 is assembled. Gasket 25 is interposed between ribs 11 and hollow walls 31 and between lip 27 and ribs 11 on outer sidewall 33. Conductive coating 22 is applied to EMI/RFI containment form 21 by either a vacuum deposition or conductive painting process that is well known in the art. Conductive coating is preferably applied to the containment form 21 by the vacuum metalization techniques described in U.S. Pat. No. 5,811,050 to Gabower.

Figure 5:
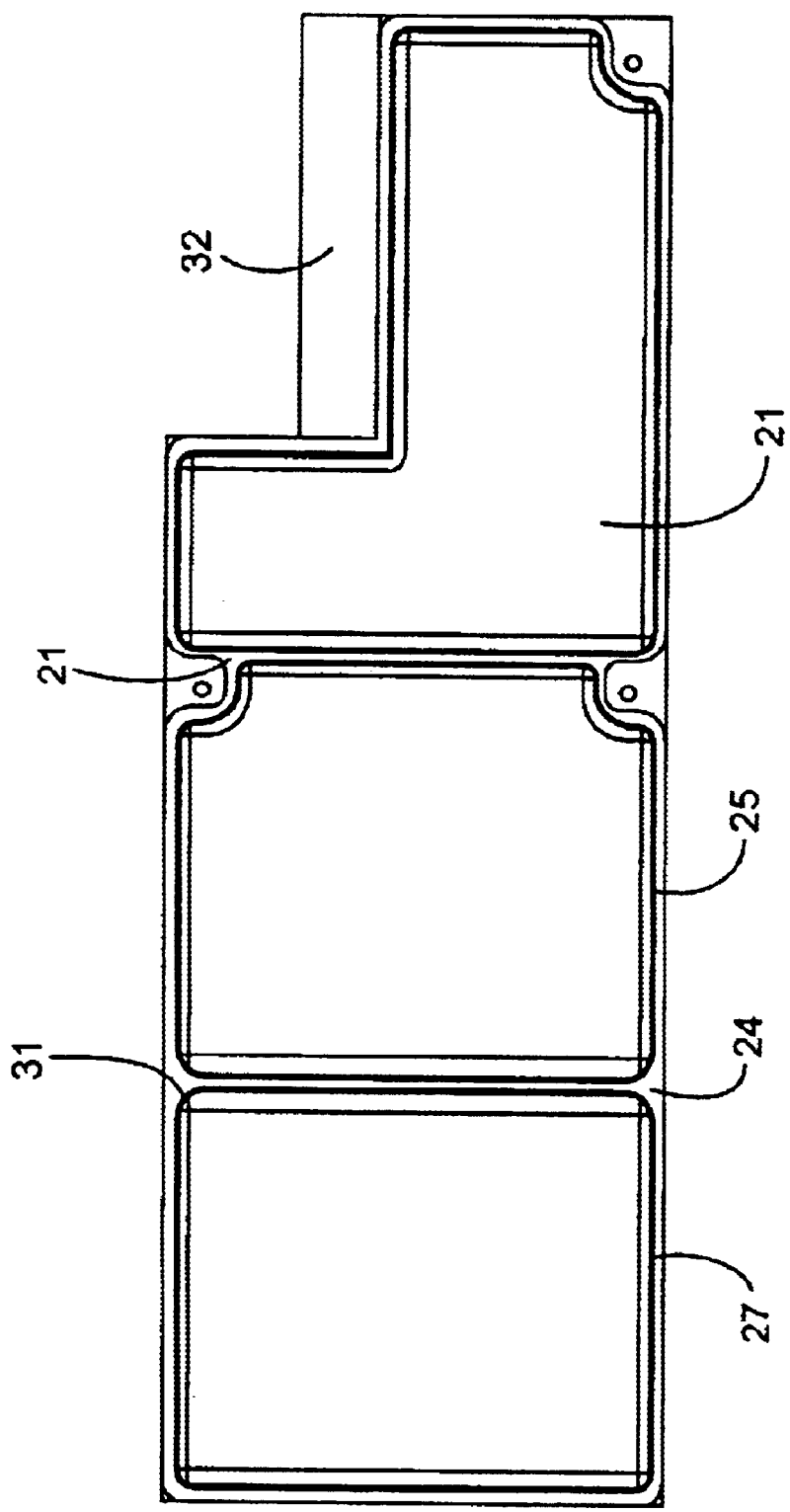
FIG. 5 is a bottom plan view of the EMI/RFI mounted to a circuit board.
Figure 6:
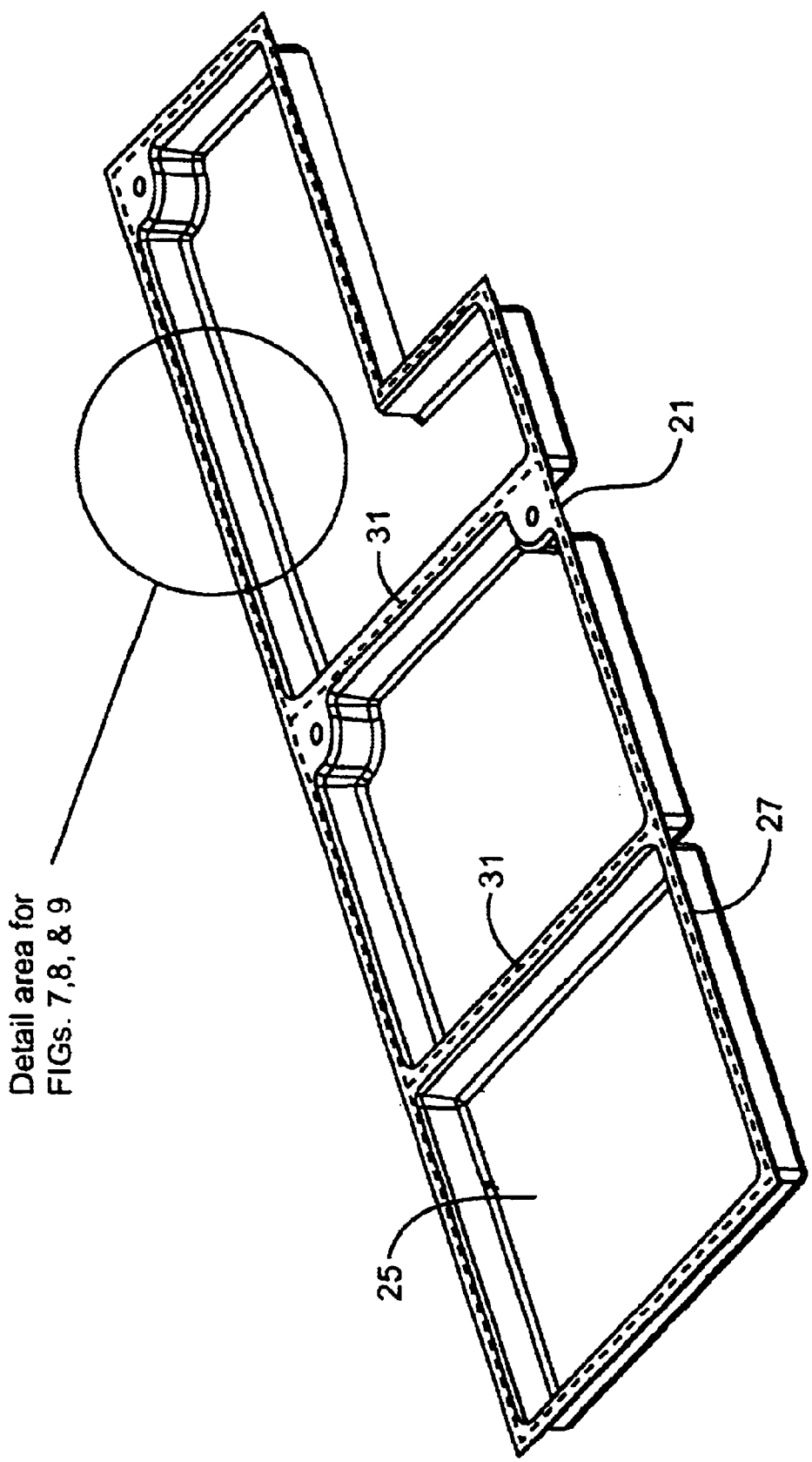
FIG. 6 is a perspective view of an alternate embodiment EMI/RFI containment form.

Referring now to FIGS. 5 and 6, gap-filling gasket 25 consists of NUVA SIL™, a liquid elastomer material product manufactured by Loctite Corporation. Gap-filling gasket 25 material is applied as a liquid within the recesses of hollow walls 31 of EMI/RFI containment form 21, and cures to an elastomeric state.

Figure 4:
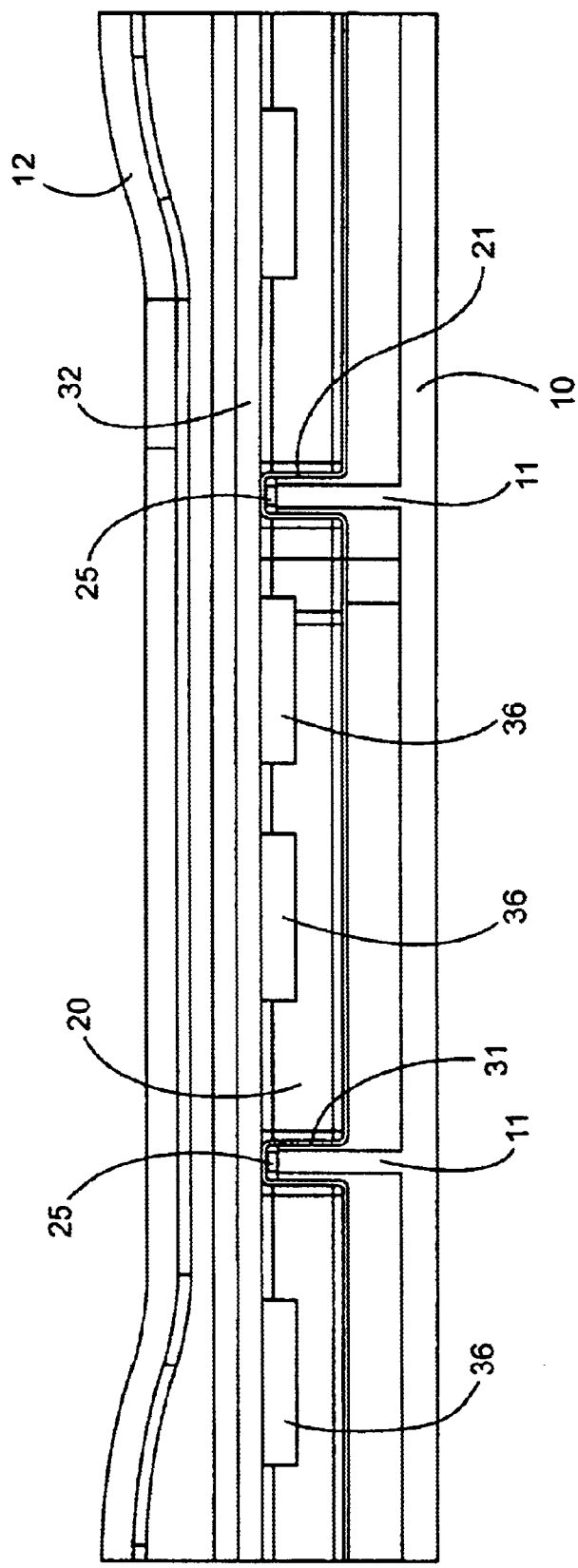
FIG. 4 is a detail cross-section view along line 4—4 of FIG. 1.

Referring now to FIGS. 2 and 4, when electronic enclosure assembly 20 is fastened together for use, EMI/RFI containment form assembly 24 is constrained by bottom enclosure housing 10 and top enclosure housing 12. EMI/RFI containment form 21 is compressed between printed circuit board and ribs 11. In an unassembled state, gap-filling gasket 25 is of a thickness that is larger than the actual distance between the top of ribs 11 and the corresponding bottom area of EMI/RFI containment form 21. Because gap-filling gasket 25 is a compliant elastomer, ribs 11 compresses gap-filling gasket 25 which in turn forces EMI/RFI containment form 21 firmly against EMI/RFI ground trace 46 on printed circuit board 32. This firm, conductive connection between EMI/RFI containment form 21 and EMI/RFI ground trace 46 on the printed circuit board 32 creates the necessary contact resistance for an effective EMI/RFI shielding seam within the given areas to be shielded in the electronic enclosure 20. The compliance of gap-filling gasket 25 also acts to fill tolerance gaps or slight misalignments between printed-circuit board 32 and EMI/RFI containment form 21.

When electronic enclosure assembly 20 is powered and being used, the flow of electricity through the electronic circuit created by printed-circuit board 32 and electronic components 36 causes EMI or RFI to propagate away from the device. The electromagnetic energy is contained and prevented from propagating outside of electronic enclosure assembly 20 by the continuous conductive enclosure created by the combination of ground plane 50, EMI/RFI ground trace 46, and EMI/RFI containment form assembly 24, which effectively constitutes a sealed Faraday cage. The Faraday cage is a well-known concept in the field of electromagnetics.

Figure 7:
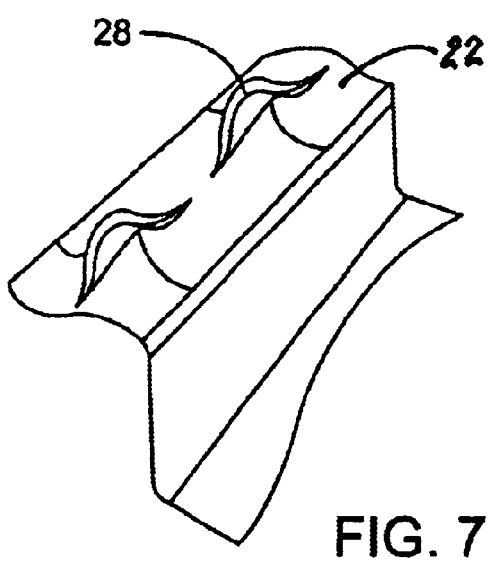
FIG. 7 is a detail cut-away view of the lip of one alternate embodiment EMI containment form showing gap-filling punctures formed on the peripheral lip of the form.

Referring now to FIG. 7, an alternative embodiment shows that a plurality of gap-filling punctures 28 may be used in place of gap-filling gasket 25. Gap-filling punctures 28 are created by a die-cutting process whereby a die with a plurality of discrete blades punctures through the top surface of lip 27 and hollow walls 31 of EMI/RFI containment form 21. The die is in the exact shape of the top-most surface of EMI/RFI containment form 21. When the blades puncture the polyester material, they deform the material around the puncture slightly up and away from the top surface. Gap-filling punctures 28 are formed into EMI/RFI containment form 21 before conductive coating 22 is applied. When assembled as described above, gap-filling punctures are forced compliantly against EMI/RFI ground trace 46 by ribs 11 and outer wall 33. Since gap-filling punctures 28 are covered with conductive coating 22, a continuous, conductive shield is maintained that prohibits the EMI/RFI that is radiated by electronic components 36 from propagating outside of electronic enclosure assembly 24. The spacing between punctures 28 is chosen to be less than one-half wavelength of the EMI radiation anticipated in order to prevent leaking of EMI.

Figure 8:
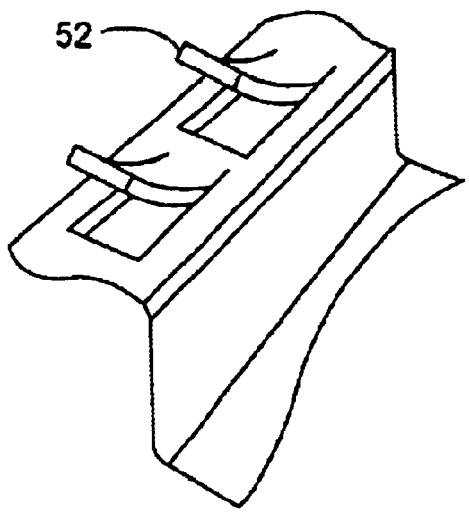
FIG. 8 is a detail cut-away view of a gap-filling tab of one alternate embodiment EMI containment form showing gap-filling punctures formed on the peripheral lip of the form.

FIG. 8 discloses a close up view of a portion of lip 27 which has been modified with gap-filling bent tabs 52 creating upstanding flaps closely and evenly spaced apart on lip 27 with the spaces between neighboring gap-filling bent tabs 52 being less than one-half wavelength of the frequency to be contained. Such gap-filling bent tabs 52 may also be formed in hollow walls 31 of form 21. The gap-filling bent tabs 52 are forced against ground trace 46 by ribs 11 and outer wall 33 of housing 10 when form 21 and circuit board 32 are mounted in housing 10.

Figure 9:
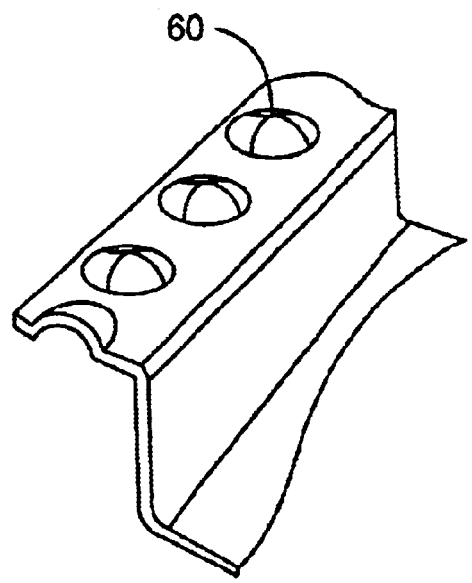
FIG. 9 is a detail cut-away view of gap filling dimple of one alternate embodiment EMI containment form showing gap-filling punctures formed on the peripheral lip of the form.

Referring now to FIG. 9, another alternative embodiment shows that a plurality of gap-filling dimples 60 may be used in place of gap-filling gasket 25. Gap-filling dimples 60 are created by a forming process whereby small semi-circles are formed along the top surface of EMI/RFI containment form 21. Gap-filling dimples 60 protrude in the direction of printed circuit board 32. Gap-filling dimples 60 are formed into EMI/RFI containment form 21 before conductive coating 22 is applied. When assembled as described above, gap-filling dimples 60 are forced compliantly against EMI/RFI ground trace 46 by ribs 11. Since gap-filling dimples are covered with conductive coating 22, a continuous, conductive shield is maintained that prohibits the EMI/RFI that is radiated by electronic components 36 from propagating outside of electronic enclosure assembly 24.

Although the description above contains many specificities, these should not be construed as limiting the scope of the invention, but merely providing illustration of some of the presently preferred embodiments of this invention. EMI/RFI containment form 21 could be manufactured out of a variety of different plastics. Gap-filling gasket 25 could be constructed out of a variety of different compliant materials. For example, gap-filling gasket 25 could be die-cut out of elastomeric sheet material. Other molded-in gap-filling features could be included other than gap-filling dimples 60. For example, gap-filling bent tabs 52 could be molded and die-cut into EMI/RFI containment form 21, as shown in FIG. 8.

Although the description of this invention shows a cellular phone, this invention could also be used for RFI shielding such as may be required in radios, portable computers, PDAs (Personal Digital Assistants), or other devices that must be prevented from emitting EMI.

Having described the invention, we claim:

1. An EMI shield for mounting in a rigid housing for a circuit board, the housing having peripheral sidewalls, comprises
   a thermoform formed by heating thermoformable sheet and drawing it into a mold or onto a die,
   the thermoform having a vacuum deposited metal coating thereon of a thickness of at least one micron,
   said thermoform conforming to said rigid housing and fitting conformingly between the sidewalls thereof,
   said thermoform having a peripheral, outwardly extending lip thereon,
   said lip having a first surface and an opposing second surface,
   the circuit board having a ground trace fixed to an outer surface thereof,
   said first surface of said lip abuttable to the ground trace of the circuit board,
   a gasket of elastomeric material disposed between said sidewall and said second surface,
   whereby said gasket urges said first surface of said lip into touching engagement with said ground trace.

2. A system for containment of EMI and RFI in an electronic device having a generally rigid housing and having a circuit board mountable within the housing comprises
   a polymeric thermoform having a peripheral sidewall, said sidewall having an outwardly extending lip thereon,
   said peripheral sidewall defining at least one polygonal compartment on said thermoform,
   said compartment having an open side,
   said thermoform having a first face and a second face,
   said thermoform having a conductive metal coating on at least the first face thereof,
   the open side of said at least one compartment coincident with said first face of said thermoform,
   said circuit board having a first side populated with at least one emitting component and having a ground trace fixed thereto, said polygonal compartment overlying said at least one emitting component, said ground trace in registry with said lip and touchingly engaged therewith, said housing having at least one opentopped enclosure formed therein, said at least one enclosure defined by upstanding ribs on said housing, said at least one enclosure receiving said compartment of said thermoform, said lip in registry with said upstanding ribs, an elastomeric gasket interposed between said ribs and said second face of said thermoform, whereby said elastomeric gasket urges said lip into touching engagement with said ground trace.

3. A system for containment of EMI and RFI in an electronic device having a generally rigid housing and having a circuit board mountable within the housing comprises a polymeric form having multiple compartments defined by hollow walls integrally formed in said form, each of said compartments having an open side, said form being a thermoform, said form having a first face and a second face, each of said open sides of said compartments coincide with said first face of said form, said form having a conductive metal coating on all of at least said first face thereof, said circuit board having a first side populated with a plurality of electronic components and having a ground trace fixed thereto, said compartments overlying at least some of said electronic components, said ground trace in registry with said hollow walls and touchingly engaged therewith, said housing having at least multiple opentopped enclosures formed therein, said enclosures defined by upstanding ribs on said housing, said enclosures receiving said compartments of said form, said hollow walls in registry with said upstanding ribs, an elastomeric gasket interposed between said ribs and said second face of said form, whereby said elastomeric gasket urges said hollow walls into touching engagement with said ground trace.

4. The system of claim 3 wherein said metal coating is continuous and smooth, comprising a vacuum deposited layer at least one micron in thickness.

5. The system of claim 3 wherein said form has a peripheral sidewall having an outwardly extending lip thereon, said enclosure having an outer wall, said lip in registry with said outer wall of said enclosure, said lip in registry with said ground trace, said gasket disposed upon said outer wall of said enclosure and under said lip, said ground trace further in registry with said lip, whereby said gasket further urges said lip into touching engagement with said ground trace.

6. A system for containment of EMI and RFI in an electronic device having a generally rigid housing and having a circuit board mountable within the housing comprises a polymeric form having a peripheral sidewall, said sidewall having an outwardly extending lip thereon, said form having a first face and a second face, said form being a thermoform, said peripheral sidewall defining at least one polygonal compartment on said form, said compartment having an open side, said form having a conductive metal coating on at least the first face thereof, the open side of said at least one compartment coincident with said first face of said form, said circuit board having a first side populated with at least one emitting component and having a ground trace fixed thereto, said polygonal compartment overlying said at least one emitting component, said ground trace in registry with said lip, said housing having at least one opentopped enclosure formed therein, said at least one enclosure defined by upstanding ribs on said housing, said at least one enclosure receiving said compartment of said form, said lip in registry with said upstanding ribs, said lip having a multiplicity of spaced apart protrusions formed therein.

7. The EMI containment system of claim 6 wherein said protrusions comprise dimples pressed into said lip of said form.

8. The EMI containment system of claim 6 wherein said protrusions comprise die cut tabs formed on and extending from said lip of said form.

9. The EMI containment system of claim 6 wherein said protrusions comprise die cut punctures formed on and extending from said lip of said form.

10. The containment system of claim 6 wherein said protrusions comprise dimples pressed into said lip of said form.

11. The containment system of claim 6 wherein said protrusions extend from said first face of said form, whereby said protrusions are urged by said ribs into touching engagement with said ground trace.

12. The containment system of claim 6 wherein said protrusions extend from said second face of said form, whereby said protrusions urge said lip into touching engagement with said ground trace.

13. A method of shielding EMI/RFI in an electronic device, the method comprising coupling a containment form to a printed circuit board, said containment form being a thermoform;

grounding the containment form to a ground trace; and compressing the containment form against the ground trace by contacting a portion of a housing of the electronic device against the containment form.

14. The method of claim 13 wherein the containment form is a metallized thermoform.

15. The method of claim 14 further comprising vacuum metallizing the thermoform.

16. The method of claim 13 wherein grounding comprises contacting a protruding lip of the containment form against the ground trace.

17. The method of claim 13 wherein grounding comprises creating a Faraday cage.

18. The method of claim 13 wherein compressing comprises forcing ribs of the housing against the containment form so as to urge the containment form against the ground trace.

19. The method of claim 18 wherein forcing comprises receiving the ribs in cavities in the containment form.

20. The method of claim 13 further comprising positioning a non-conductive gasket between the housing and the containment form.

21. The method of claim 20 further comprising urging a rib of the housing against the nonconductive gasket so as to urge the containment form against the ground trace.

22. A system for shielding EMI/RFI, the system comprising:

a housing;

a circuit board comprising a ground trace, the circuit board being positioned within the housing;

a containment form comprising a lip which extends around a periphery of the containment form, said containment for being a thermoform;

a vacuum metallized layer attached to the containment form, wherein the vacuum metallized layer is capable of shielding EMI/RFI radiation;

wherein the containment form is positioned in the housing so that the housing urges the containment form into contact with the ground trace so as to shield the circuit board from the EMI/RFI radiation.

23. The system of claim 22 wherein the housing comprises four side walls and ribs, the containment form is received within the housing between the four side walls and the ribs contact the containment form to urge the containment form against the ground trace.

24. The system of claim 23 wherein the containment form comprises at least one hollow wall to receive the ribs.

25. The system of claim 22 wherein the containment form comprises dimples disposed on the lip.

26. The system of claim 22 further comprises compressing a compressible gasket positioned between the housing and the containment form, wherein the housing contacts the gasket to resiliently urge the containment form against the ground trace.

27. The system of claim 23 wherein the containment form comprises a plurality of compartments.

* * * * *